(12) United States Patent
Zack et al.

(10) Patent No.: US 11,122,698 B2
(45) Date of Patent: Sep. 14, 2021

(54) LOW STRESS ELECTRONIC BOARD RETAINERS AND ASSEMBLIES

(71) Applicant: N2 Imaging Systems, LLC, Irvine, CA (US)

(72) Inventors: Darren M. Zack, Yorba Linda, CA (US); Jay Meyer, Snohomish, WA (US)

(73) Assignee: N2 Imaging Systems, LLC, Irvine, CA (US)

( * ) Notice: Subject to any disclaimer, the term of this patent is extended or adjusted under 35 U.S.C. 154(b) by 263 days.

(21) Appl. No.: 16/182,490

(22) Filed: Nov. 6, 2018

(65) Prior Publication Data

US 2020/0146161 A1    May 7, 2020

(51) Int. Cl.
  *H05K 5/00* (2006.01)
  *H05K 1/02* (2006.01)
  *G01C 21/16* (2006.01)
  *H01R 12/71* (2011.01)

(52) U.S. Cl.
  CPC .......... *H05K 5/0056* (2013.01); *G01C 21/16* (2013.01); *H05K 1/0271* (2013.01); *H05K 5/006* (2013.01); *H05K 5/0052* (2013.01); *H01R 12/716* (2013.01)

(58) Field of Classification Search
  CPC ....... H05K 5/0047–006; H05K 1/0271; H01R 12/716
  See application file for complete search history.

(56) References Cited

U.S. PATENT DOCUMENTS

| | | |
|---|---|---|
| 2,452,592 A | 11/1948 | Meyer |
| 2,627,659 A | 2/1953 | Murr |
| 2,643,845 A | 6/1953 | Baker |
| 2,901,750 A | 9/1959 | McMurry |
| 2,901,751 A | 9/1959 | Gales et al. |
| 2,908,943 A | 10/1959 | Miller |
| 3,320,619 A | 5/1967 | Lastnik et al. |
| 3,413,656 A | 12/1968 | Vogliano et al. |
| 3,419,334 A | 12/1968 | Hubbard |
| 3,594,061 A | 7/1971 | Selvage et al. |
| 3,594,062 A | 7/1971 | Disley |

(Continued)

FOREIGN PATENT DOCUMENTS

| | | |
|---|---|---|
| CN | 202057884 | 11/2011 |
| CN | 204730844 U | * 10/2015 |

(Continued)

OTHER PUBLICATIONS

EPEC, Aluminum Circuit Boards, (Year: 2018).*

(Continued)

*Primary Examiner* — David L Singer
(74) *Attorney, Agent, or Firm* — Knobbe, Martens Olson & Bear, LLP

(57) ABSTRACT

An electronics assembly can include a circuit board comprising a stress sensitive device and a stiffening member operatively connected to the circuit board to stiffen the circuit board. The assembly can include a housing disposed around the circuit board and the stiffening member to contain circuit board and the stiffening member. The assembly can include one or more elastic and/or flexible bumpers disposed between the circuit board and the housing to provide shock absorption to the circuit board within the housing.

13 Claims, 2 Drawing Sheets

(56) References Cited

U.S. PATENT DOCUMENTS

| | | |
|---|---|---|
| 3,640,635 A | 2/1972 | Von Hollen |
| 3,669,523 A | 6/1972 | Edwards |
| 4,044,399 A | 8/1977 | Morton |
| 4,183,646 A | 1/1980 | Tsunefuji |
| 4,198,872 A | 4/1980 | Metz |
| 4,415,952 A | 11/1983 | Hattori et al. |
| 4,584,776 A | 4/1986 | Shepherd |
| 4,601,540 A | 7/1986 | Karning et al. |
| 4,605,281 A | 8/1986 | Hellewell |
| 4,630,903 A | 12/1986 | Jones |
| 4,698,489 A | 10/1987 | Morley |
| 4,758,719 A | 7/1988 | Sasaki et al. |
| 4,786,966 A | 11/1988 | Hanson et al. |
| 4,792,206 A | 12/1988 | Skuratovsky |
| 4,840,451 A | 6/1989 | Sampson et al. |
| 4,896,552 A | 1/1990 | Virga |
| 5,005,213 A | 4/1991 | Hanson et al. |
| 5,035,472 A | 7/1991 | Hansen |
| 5,125,394 A | 6/1992 | Chatenever et al. |
| 5,128,807 A | 7/1992 | Blackmon |
| 5,140,151 A | 8/1992 | Weiner et al. |
| 5,144,533 A * | 9/1992 | Annett ............... H05K 5/0013 312/223.1 |
| 5,263,381 A | 11/1993 | Shirai |
| 5,303,606 A | 4/1994 | Kokinda |
| 5,303,688 A | 4/1994 | Chiuminatta et al. |
| 5,359,675 A | 10/1994 | Siwoff |
| 5,408,359 A | 4/1995 | Ferrett et al. |
| 5,448,161 A | 9/1995 | Byerley, III et al. |
| 5,463,495 A | 10/1995 | Murg |
| 5,492,030 A | 2/1996 | Benton et al. |
| 5,513,440 A | 5/1996 | Murg |
| 5,535,053 A | 7/1996 | Baril et al. |
| 5,584,137 A | 12/1996 | Teetzel |
| 5,623,367 A | 4/1997 | Immel |
| 5,644,951 A | 7/1997 | Hatamura |
| 5,651,081 A | 7/1997 | Blew et al. |
| 5,653,034 A | 8/1997 | Bindon |
| 5,668,904 A | 9/1997 | Sutherland et al. |
| 5,687,271 A | 11/1997 | Rabinowitz |
| 5,711,104 A | 1/1998 | Schmitz |
| 5,749,265 A | 5/1998 | Namimatsu et al. |
| 5,754,350 A | 5/1998 | Sato |
| 5,802,914 A | 9/1998 | Fassler et al. |
| 5,813,990 A | 9/1998 | Ryll |
| 5,842,054 A | 11/1998 | Suzuki et al. |
| 5,847,753 A | 12/1998 | Gabello et al. |
| 5,881,449 A | 3/1999 | Ghosh et al. |
| 5,903,996 A | 5/1999 | Morley |
| 5,946,132 A | 8/1999 | Phillips |
| 5,949,565 A | 9/1999 | Ishida |
| 5,953,761 A | 9/1999 | Jurga et al. |
| 5,956,444 A | 9/1999 | Duda et al. |
| 5,958,556 A | 9/1999 | McCutcheon |
| 5,959,705 A | 9/1999 | Fergason |
| 6,020,994 A | 2/2000 | Cook |
| 6,057,966 A | 5/2000 | Carroll et al. |
| 6,200,041 B1 | 3/2001 | Gaio et al. |
| 6,233,153 B1 * | 5/2001 | Baur .................. H05K 5/006 361/752 |
| 6,272,692 B1 | 8/2001 | Abraham |
| 6,311,576 B1 | 11/2001 | Pletschet |
| 6,327,381 B1 | 12/2001 | Rogina et al. |
| 6,349,003 B1 | 2/2002 | Ko |
| 6,369,941 B2 | 4/2002 | Zadravec |
| 6,381,081 B1 | 4/2002 | Ford |
| 6,404,961 B1 | 6/2002 | Bonja et al. |
| 6,456,497 B1 | 9/2002 | Palmer |
| 6,519,890 B1 | 2/2003 | Otterman |
| 6,560,029 B1 | 5/2003 | Dobbie et al. |
| 6,574,053 B1 | 6/2003 | Spinali |
| 6,615,531 B1 | 9/2003 | Holmberg |
| 6,690,866 B2 | 2/2004 | Bonja et al. |
| 6,714,708 B2 | 3/2004 | McAlpine et al. |
| 6,737,596 B1 | 5/2004 | Hein |
| 6,807,742 B2 | 10/2004 | Schick et al. |
| 6,816,381 B2 | 11/2004 | Takeuchi |
| 6,898,192 B2 | 5/2005 | Chheda et al. |
| 6,901,221 B1 | 5/2005 | Jiang et al. |
| 7,016,579 B2 | 3/2006 | Militaru et al. |
| 7,062,796 B1 | 6/2006 | Dixon |
| D524,785 S | 7/2006 | Huang |
| 7,069,685 B2 | 7/2006 | Houde-Walter |
| 7,075,738 B2 | 7/2006 | Ross et al. |
| 7,096,512 B2 | 8/2006 | Blair |
| 7,128,475 B2 | 10/2006 | Kesler |
| 7,132,648 B2 | 11/2006 | Ratiff et al. |
| 7,156,564 B2 | 1/2007 | Watanabe et al. |
| 7,166,812 B2 | 1/2007 | White et al. |
| 7,171,776 B2 | 2/2007 | Staley, III |
| 7,194,012 B2 | 3/2007 | Mason et al. |
| 7,199,945 B2 | 4/2007 | Tsuzuki |
| 7,210,262 B2 | 5/2007 | Florence et al. |
| 7,210,392 B2 | 5/2007 | Greene et al. |
| 7,219,370 B1 | 5/2007 | Teetzel et al. |
| 7,278,734 B2 | 10/2007 | Jannard et al. |
| 7,292,262 B2 | 11/2007 | Towery et al. |
| 7,298,941 B2 | 11/2007 | Palen et al. |
| 7,319,557 B2 | 1/2008 | Tai |
| 7,369,302 B2 | 5/2008 | Gaber |
| 7,409,792 B2 | 8/2008 | Narcy et al. |
| 7,437,848 B2 | 10/2008 | Chang |
| 7,462,035 B2 | 12/2008 | Lee et al. |
| 7,488,294 B2 | 2/2009 | Torch |
| 7,505,053 B2 | 3/2009 | Brown Elliott et al. |
| 7,552,559 B2 | 6/2009 | Day |
| 7,609,467 B2 | 10/2009 | Blanding et al. |
| 7,612,956 B2 | 11/2009 | Blanding et al. |
| 7,627,975 B1 | 12/2009 | Hines |
| 7,634,189 B2 | 12/2009 | Hong et al. |
| 7,649,550 B2 | 1/2010 | Ishiyama et al. |
| 7,676,137 B2 | 3/2010 | Schick et al. |
| 7,690,849 B2 | 4/2010 | Scharf et al. |
| 7,701,493 B2 | 4/2010 | Mauritzson |
| 7,705,855 B2 | 4/2010 | Brown Elliott |
| 7,710,654 B2 | 5/2010 | Ashkenazi et al. |
| 7,730,820 B2 | 6/2010 | Vice et al. |
| 7,740,499 B1 | 6/2010 | Willey et al. |
| 7,744,286 B2 | 6/2010 | Lu et al. |
| 7,768,703 B2 | 8/2010 | Winker et al. |
| 7,787,012 B2 | 8/2010 | Scales et al. |
| 7,795,574 B2 | 9/2010 | Kennedy et al. |
| 7,800,065 B2 | 9/2010 | Konkle et al. |
| 7,800,852 B2 | 9/2010 | Blanding et al. |
| 7,805,080 B2 | 9/2010 | Wang et al. |
| 7,827,723 B1 | 11/2010 | Zaderey et al. |
| 7,832,023 B2 | 11/2010 | Crisco |
| 7,842,922 B2 | 11/2010 | Leneke et al. |
| 7,899,332 B2 | 3/2011 | Shindou et al. |
| 7,911,687 B2 | 3/2011 | Scholz |
| 7,916,156 B2 | 3/2011 | Brown Elliott et al. |
| 7,933,464 B2 | 4/2011 | Zhang et al. |
| 7,952,059 B2 | 5/2011 | Vitale et al. |
| 7,965,305 B2 | 6/2011 | Miller et al. |
| 7,972,067 B2 | 7/2011 | Haley et al. |
| 7,990,523 B2 | 8/2011 | Schlierbach et al. |
| 8,004,769 B2 | 8/2011 | Spaller |
| 8,014,679 B2 | 9/2011 | Yamazaki |
| 8,051,729 B2 | 11/2011 | Yoshida et al. |
| 8,063,934 B2 | 11/2011 | Donato |
| 8,067,735 B2 | 11/2011 | King et al. |
| 8,082,688 B2 | 12/2011 | Elpedes et al. |
| 8,085,482 B2 | 12/2011 | Frankovich et al. |
| 8,093,992 B2 | 1/2012 | Jancic et al. |
| 8,112,185 B2 | 2/2012 | Wu |
| 8,153,975 B2 | 4/2012 | Hollander et al. |
| 8,225,542 B2 | 7/2012 | Houde-Walter |
| 8,253,105 B1 | 8/2012 | Warnke et al. |
| 8,312,667 B2 | 11/2012 | Thomas et al. |
| 8,336,776 B2 | 12/2012 | Horvath et al. |
| 8,337,036 B2 | 12/2012 | Soto et al. |
| 8,350,796 B2 | 1/2013 | Tomizawa et al. |
| 8,365,455 B2 | 2/2013 | Davidson |
| 8,375,620 B2 | 2/2013 | Staley, III |

(56) References Cited

U.S. PATENT DOCUMENTS

| | | |
|---|---|---|
| 8,379,307 B2 | 2/2013 | Thomas et al. |
| D677,298 S | 3/2013 | Hallgren |
| 8,411,346 B2 | 4/2013 | Sapir |
| 8,488,969 B1 | 7/2013 | Masarik |
| 8,526,108 B2 | 9/2013 | Weinold et al. |
| 8,531,592 B2 | 9/2013 | Teetzel et al. |
| 8,532,490 B2 | 9/2013 | Smith et al. |
| 8,656,628 B2 | 2/2014 | Jock et al. |
| 8,672,491 B2 | 3/2014 | Immel |
| 8,717,392 B2 | 5/2014 | Levola |
| 8,720,102 B2 | 5/2014 | Allen et al. |
| 8,739,313 B2 | 6/2014 | Teetzel et al. |
| 8,773,766 B2 | 7/2014 | Jannard et al. |
| 8,776,422 B2 | 7/2014 | Dodd et al. |
| 8,781,273 B2 | 7/2014 | Benjamin et al. |
| 8,826,583 B2 | 9/2014 | Kepler et al. |
| 8,849,379 B2 | 9/2014 | Abreu |
| 8,874,284 B2 | 10/2014 | Sanders-Reed |
| 8,886,046 B2 | 11/2014 | Masarik |
| 8,903,317 B2 | 12/2014 | Wu |
| 8,908,045 B2 | 12/2014 | Stewart |
| 8,915,008 B2 | 12/2014 | Mauricio et al. |
| 8,919,724 B2 | 12/2014 | Rangaswamy et al. |
| 8,923,703 B2 | 12/2014 | Masarik |
| 8,928,878 B2 | 1/2015 | Jaeschke et al. |
| 8,942,632 B2 | 1/2015 | Shen |
| 8,963,573 B2 | 2/2015 | Achkir et al. |
| 8,984,665 B2 | 3/2015 | Celona et al. |
| 9,042,105 B2 | 5/2015 | Malek et al. |
| 9,042,736 B2 | 5/2015 | Masarik |
| 9,052,153 B2 | 6/2015 | Oh et al. |
| 9,057,583 B2 | 6/2015 | Matthews et al. |
| 9,059,562 B2 | 6/2015 | Priest et al. |
| 9,069,001 B2 | 6/2015 | Braman et al. |
| 9,093,231 B2 | 7/2015 | Fujita et al. |
| 9,113,061 B1 | 8/2015 | Morley |
| 9,115,956 B2 | 8/2015 | Hakanson et al. |
| 9,121,671 B2 | 9/2015 | Everett |
| 9,170,068 B2 | 10/2015 | Crispin |
| 9,191,583 B2 | 11/2015 | Hamrelius et al. |
| 9,225,419 B2 | 12/2015 | Masarik |
| 9,246,579 B2 | 1/2016 | Hara et al. |
| 9,285,589 B2 | 3/2016 | Osterhout et al. |
| 9,303,952 B2 | 4/2016 | Hakansson et al. |
| 9,310,163 B2 | 4/2016 | Bay |
| 9,316,462 B2 | 4/2016 | Varshneya |
| 9,319,143 B2 | 4/2016 | El-Ahmadi et al. |
| 9,335,122 B2 | 5/2016 | Choiniere |
| 9,366,504 B2 | 6/2016 | Hester et al. |
| 9,373,277 B2 | 6/2016 | Sagan |
| 9,389,677 B2 | 7/2016 | Hobby et al. |
| 9,429,391 B2 | 8/2016 | Walker |
| 9,429,745 B2 | 8/2016 | Brumfield |
| 9,438,774 B2 | 9/2016 | Masarik |
| 9,466,120 B2 | 10/2016 | Maryfield et al. |
| 9,481,466 B2 | 11/2016 | Fischer et al. |
| 9,506,725 B2 | 11/2016 | Maryfield et al. |
| 9,516,202 B2 | 12/2016 | Masarik et al. |
| 9,516,266 B2 | 12/2016 | Pycock et al. |
| 9,593,913 B1 | 3/2017 | Wright et al. |
| 9,615,004 B2 | 4/2017 | Masarik |
| 9,622,529 B2 | 4/2017 | Teetzel et al. |
| 9,631,899 B2 | 4/2017 | Lebel et al. |
| 9,658,423 B2 | 5/2017 | Gustafson et al. |
| 9,696,111 B2 | 7/2017 | Saadon |
| 9,705,605 B2 | 7/2017 | Masarik |
| 9,769,902 B1 | 9/2017 | Cain et al. |
| 9,772,343 B2 | 9/2017 | Wang et al. |
| 9,816,782 B2 | 11/2017 | Maryfield et al. |
| 9,817,225 B2 | 11/2017 | Gotz et al. |
| 9,823,043 B2 | 11/2017 | Compton et al. |
| 9,861,263 B2 | 1/2018 | Kwan et al. |
| 9,891,023 B2 | 2/2018 | Compton et al. |
| 9,897,411 B2 | 2/2018 | Compton et al. |
| 9,910,259 B2 | 3/2018 | Armbruster et al. |
| 9,921,028 B2 | 3/2018 | Compton et al. |
| 9,934,739 B2 | 4/2018 | Hogan |
| 9,948,878 B2 | 4/2018 | Simolon et al. |
| 9,995,901 B2 | 6/2018 | Petersen |
| 10,003,756 B2 | 6/2018 | Masarik et al. |
| 10,024,631 B2 | 7/2018 | Portoghese et al. |
| 10,036,869 B2 | 7/2018 | Fahr et al. |
| 10,082,879 B2 | 9/2018 | Niinuma et al. |
| 10,095,089 B2 | 10/2018 | Po et al. |
| 10,113,837 B2 | 10/2018 | Masarik et al. |
| 10,151,564 B2 | 12/2018 | Galli |
| 10,163,269 B2 | 12/2018 | Hiranandani et al. |
| 10,190,848 B2 | 1/2019 | VanBecelaere |
| 10,309,749 B2 | 6/2019 | Hamilton |
| 10,368,454 B2 | 7/2019 | Liu et al. |
| 10,379,135 B2 | 8/2019 | Maryfield et al. |
| 10,418,767 B2 | 9/2019 | Azad |
| 10,458,754 B2 | 10/2019 | Miller et al. |
| 10,492,555 B2 | 12/2019 | Lebel et al. |
| 10,584,941 B2 | 3/2020 | Masarik et al. |
| 10,645,348 B2 | 5/2020 | Moseman et al. |
| 10,673,301 B1 | 6/2020 | McAuley |
| 10,687,443 B2 | 6/2020 | Rojahn et al. |
| 10,693,341 B1 | 6/2020 | McAuley |
| 10,718,909 B2 | 7/2020 | Noll et al. |
| 10,721,000 B2 | 7/2020 | Masarik |
| 10,742,913 B2 | 8/2020 | Vaklev et al. |
| 10,753,709 B2 | 8/2020 | Neal |
| 10,782,096 B2 | 9/2020 | Pautler |
| 10,783,111 B2 | 9/2020 | Moseman |
| 10,788,508 B2 | 9/2020 | Pan et al. |
| 10,796,860 B2 | 10/2020 | Iliev et al. |
| 10,801,813 B2 | 10/2020 | Moseman et al. |
| 10,812,687 B2 | 10/2020 | Masarik et al. |
| 10,852,838 B2 | 12/2020 | Bradski et al. |
| 2001/0028555 A1* | 10/2001 | Takeuchi ............... H05K 5/006 361/752 |
| 2002/0027690 A1 | 3/2002 | Bartur et al. |
| 2004/0031184 A1 | 2/2004 | Hope |
| 2005/0114710 A1 | 5/2005 | Cornell et al. |
| 2005/0232512 A1 | 10/2005 | Luk et al. |
| 2005/0254126 A1 | 11/2005 | Lin et al. |
| 2005/0268519 A1 | 12/2005 | Pikielny |
| 2006/0165413 A1 | 7/2006 | Schemmann et al. |
| 2007/0003562 A1 | 1/2007 | Druilhe |
| 2007/0035626 A1 | 2/2007 | Randall et al. |
| 2007/0213586 A1 | 9/2007 | Hirose et al. |
| 2008/0263752 A1 | 10/2008 | Solinsky et al. |
| 2008/0309586 A1 | 12/2008 | Vitale |
| 2009/0181729 A1 | 7/2009 | Griffin, Jr. et al. |
| 2009/0308192 A1 | 12/2009 | Lin et al. |
| 2009/0316372 A1* | 12/2009 | Kozlovski ............ H05K 5/006 361/757 |
| 2010/0001195 A1* | 1/2010 | Konkle ............ H01L 27/14618 250/370.09 |
| 2010/0027943 A1 | 2/2010 | Armani et al. |
| 2010/0149073 A1 | 6/2010 | Chaum et al. |
| 2010/0225673 A1 | 9/2010 | Miller et al. |
| 2010/0226017 A1* | 9/2010 | Spaller ............... G02B 27/0172 359/630 |
| 2010/0266245 A1 | 10/2010 | Sabo |
| 2010/0308999 A1 | 12/2010 | Chornenky |
| 2010/0328420 A1 | 12/2010 | Roman |
| 2011/0213664 A1 | 9/2011 | Osterhout et al. |
| 2011/0214082 A1 | 9/2011 | Osterhout et al. |
| 2012/0033195 A1 | 2/2012 | Tai |
| 2012/0097741 A1 | 4/2012 | Karcher |
| 2012/0238208 A1 | 9/2012 | Bienas et al. |
| 2012/0255213 A1 | 10/2012 | Panos |
| 2012/0311910 A1 | 12/2012 | Mironichev et al. |
| 2012/0320340 A1 | 12/2012 | Coleman, III |
| 2012/0327247 A1 | 12/2012 | Mironichev et al. |
| 2013/0016215 A1 | 1/2013 | Bitar et al. |
| 2013/0036646 A1 | 2/2013 | Rubac et al. |
| 2013/0188943 A1 | 7/2013 | Wu |
| 2013/0215395 A1 | 8/2013 | Li |
| 2013/0343015 A1* | 12/2013 | Malek ................ H05K 1/0215 361/752 |
| 2014/0007485 A1 | 1/2014 | Castejon, Sr. |

(56) References Cited

U.S. PATENT DOCUMENTS

| | | | |
|---|---|---|---|
| 2014/0104449 A1 | 4/2014 | Masarik et al. | |
| 2014/0118986 A1* | 5/2014 | Suzuki | H05K 5/0056 361/821 |
| 2014/0224014 A1* | 8/2014 | Wang | G01C 21/16 73/504.04 |
| 2014/0260748 A1 | 9/2014 | Traver | |
| 2015/0226613 A1 | 8/2015 | Bauer et al. | |
| 2015/0282549 A1 | 10/2015 | Lebel et al. | |
| 2015/0316351 A1 | 11/2015 | Choiniere | |
| 2016/0033234 A1 | 2/2016 | Swift et al. | |
| 2016/0069640 A1 | 3/2016 | Pretorius | |
| 2016/0327365 A1 | 11/2016 | Collin et al. | |
| 2017/0010073 A1 | 1/2017 | Downing | |
| 2017/0078022 A1 | 3/2017 | Masarik et al. | |
| 2017/0090146 A1 | 3/2017 | Ishiguro | |
| 2017/0237919 A1 | 8/2017 | Lamesch | |
| 2017/0302386 A1 | 10/2017 | Masarik | |
| 2018/0092255 A1* | 3/2018 | Rojahn | H05K 1/181 |
| 2018/0106568 A1 | 4/2018 | Hedeen et al. | |
| 2018/0246135 A1 | 8/2018 | Pan et al. | |
| 2018/0270965 A1* | 9/2018 | Liu | H05K 7/142 |
| 2018/0302576 A1 | 10/2018 | Masarik et al. | |
| 2019/0013632 A1* | 1/2019 | Azad | H01R 31/065 |
| 2019/0056198 A1 | 2/2019 | Pautler | |
| 2019/0094981 A1 | 3/2019 | Bradski et al. | |
| 2019/0166174 A1 | 5/2019 | Moseman | |
| 2019/0222771 A1 | 7/2019 | Hedeen et al. | |
| 2019/0346235 A1 | 11/2019 | Sidelkovsky | |
| 2019/0353461 A1 | 11/2019 | Neal et al. | |
| 2019/0353462 A1 | 11/2019 | Neal | |
| 2019/0376764 A1 | 12/2019 | Hammond | |
| 2019/0377171 A1 | 12/2019 | Hammond et al. | |
| 2020/0018566 A1 | 1/2020 | Tubb | |
| 2020/0051481 A1 | 2/2020 | Masarik et al. | |
| 2020/0053303 A1 | 2/2020 | Vaklev et al. | |
| 2020/0081242 A1 | 3/2020 | Kuczek et al. | |
| 2020/0141700 A1 | 5/2020 | Moseman et al. | |
| 2020/0142176 A1 | 5/2020 | Zack et al. | |
| 2020/0194196 A1 | 6/2020 | Iliev et al. | |
| 2020/0218029 A1 | 7/2020 | Zack et al. | |
| 2020/0256438 A1 | 8/2020 | McAuley | |
| 2020/0351461 A1 | 11/2020 | Vaklev et al. | |
| 2021/0006338 A1 | 1/2021 | Masarik | |

FOREIGN PATENT DOCUMENTS

| | | | |
|---|---|---|---|
| CN | 204730844 U | | 10/2015 |
| CN | 204944509 U | * | 1/2016 |
| CN | 204944509 U | | 1/2016 |
| CN | 105423813 | | 3/2016 |
| CN | 106612141 | | 5/2017 |
| EP | 0 176 169 | | 4/1986 |
| EP | 2 722 632 | | 4/2014 |
| EP | 2 812 749 | | 12/2014 |
| EP | 3 172 524 | | 5/2017 |
| EP | 3 205 974 | | 8/2017 |
| EP | 3 239 754 | | 11/2017 |
| EP | 3 205 974 B1 | | 6/2020 |
| EP | 3 172 524 B1 | | 10/2020 |
| FR | 2917566 A1 | * | 12/2008 ........... H05K 5/0047 |
| GB | 2162654 | | 2/1986 |
| JP | H07-295682 | | 11/1995 |
| WO | WO 2005/121688 | | 12/2005 |
| WO | WO 2013/080058 | | 6/2013 |
| WO | WO 2013/102869 | | 7/2013 |
| WO | WO 2013/119983 | | 8/2013 |
| WO | WO 2014/062725 | | 4/2014 |
| WO | WO 2014/150076 | | 9/2014 |
| WO | WO 2016/014655 | | 1/2016 |
| WO | WO 2019/222422 | | 11/2019 |
| WO | WO 2019/222426 | | 11/2019 |
| WO | WO 2020/051464 | | 3/2020 |
| WO | WO 2020/096728 | | 5/2020 |

OTHER PUBLICATIONS

Amitron, Aluminum Printed Circuit Boards—Aluminum Thermal Management PCBs (Year: 2016).*
PCBGOGO, An Introduction to Aluminum PCBs (Year: 2018).*
Edgefx Technologies, What Are the Advantages of Using aPrinted Circuit Board (PCB) (Year: 2017).*
Machine Translation CN204730844U (Year: 2020).*
Machine Translation CN204944509U (Year: 2020).*
Aebi, V. et al., "EBAPS: Next Generation, Low Power, Digital Night Vision", Presented at the OPTRO 2005 International Symposium, May 10, 2005, pp. 1-10, Paris, France, in 10 pages.
Ackerman, S., "It Only Took the Army 16 Years and 2 Wars to Deploy this Network", Wired.com, Jun. 28, 2012, in 7 pages. URL: http://www.wired.com/dangerroom/2012/06/army-data-network-war/all/.
Armstrong, S. C., "Project Manager Soldier Weapons Program Overview NDIA", May 15, 2012, in 38 pages.
Schott—Glass Made of Ideas, GBPS-MC-GOF-Demo, dated Jan. 2006, pp. S.1-S.8, in 8 pages.
Sklarek, W., "High Data Rate Capabilities of Multicore Glass Optical Fiber Cables, 22 FGT 'Otische Polymerfasern'", dated Oct. 25, 2006, in 19 pages. URL: http://www.pofac.de/downloads/itgfg/fgt2.2/FGT2.2_Munchen_Sklarek_GOF-Buendel.
Tao, R. et al., "10 Gb/s CMOS Limiting Amplifier for Optical links", Proceedings of the 29th European Solid-State Circuits Conference, Sep. 16-18, 2013, pp. 285-287, Estoril, Portugal, in 3 pages.
Zhu, Z. et al., "AR-Weapon: Live Augmented Reality Based First-Person Shooting System", 2015 IEEE Winter Conference on Applications of Computer Vision, Feb. 2015, in 8 pages.

\* cited by examiner

LOW STRESS ELECTRONIC BOARD RETAINERS AND ASSEMBLIES

BACKGROUND

1. Field

The present disclosure relates to electronic board retainer assemblies.

2. Description of Related Art

In certain applications (e.g., in goggle mounted optics circuits), a printed circuit board (PCB) with an inertial measurement unit (IMU) is subjected to stress when mechanically mounting in a product (e.g., the goggle). Such stress can result in inaccurate readings from the IMU.

Such conventional methods and systems have generally been considered satisfactory for their intended purpose. However, there is still a need in the art for improved electronic board retainers and assemblies. The present disclosure provides a solution for this need.

SUMMARY

An electronics assembly can include a circuit board comprising a stress sensitive device and a stiffening member operatively connected to the circuit board to stiffen the circuit board. The assembly can include a housing disposed around the circuit board and the stiffening member to contain circuit board and the stiffening member. The assembly can include one or more elastic and/or flexible bumpers disposed between the circuit board and the housing to provide shock absorption to the circuit board within the housing.

The circuit board can be a printed circuit board (PCB). The stress sensitive device can be an inertial measurement unit (IMU). Any other suitable circuit board and/or stress sensitive device is contemplated herein.

The stiffening member can be a rigid sheet flushly attached to a flat face of the circuit board. In certain embodiments, the stiffening member includes the same shape as the circuit board. Any other suitable stiffening member is contemplated herein.

The housing can include a first housing member and a second housing member that clip together to retain the circuit board, the stiffening member, and the one or more elastic and/or flexible bumpers. In certain embodiments, the first housing member can include a flexible clip structure at a first end thereof, and the second housing member can include a mating feature configured to receive the flexible clip structure when pressed into the mating feature. The first housing member can include a retaining structure at a second end thereof opposite the first end, and the second housing member can include a clip structure configured to engage the retaining structure when pressed into the retaining structure. Any other suitable structure or means to attach the first housing and the second housing together is contemplated herein.

The second housing member can define an aperture over a data port of the circuit board to allow access to the data port when the housing is assembled. The second housing member can include a window opening to allow access to and/or clearance for one or more circuit components.

In certain embodiments, the one or more bumpers can include a plurality of bumpers disposed on a device side of the circuit board between the second housing member and the circuit board, and a plurality of bumpers disposed on a stiffener side between the stiffener and the first housing member. The plurality of bumpers can include a dumbbell shape having a plurality of wide portions connected by a thinner neck. The plurality of bumpers can each include a bumper post extending from each side of each wide portion configured to register each bumper relative to the circuit board and the housing.

The first housing member, the second housing member, the circuit board, and the stiffener can each include holes for receiving each bumper post. The housing can be shaped to mount to or within a goggle or optic. Any other suitable shape is contemplated herein.

In accordance with at least one aspect of this disclosure, a method can include attaching a circuit board comprising a stress sensitive device to a stiffening member operatively connected to the circuit board to stiffen the circuit board, disposing the circuit board and stiffening member within a housing to contain the circuit board and the stiffening member, and disposing one or more elastic and/or flexible bumpers between the circuit board and the housing to provide shock absorption to the circuit board within the housing. The method can include mounting the housing containing the circuit board, stiffening member and the one or more elastic and/or flexible bumpers within a goggle or optic.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
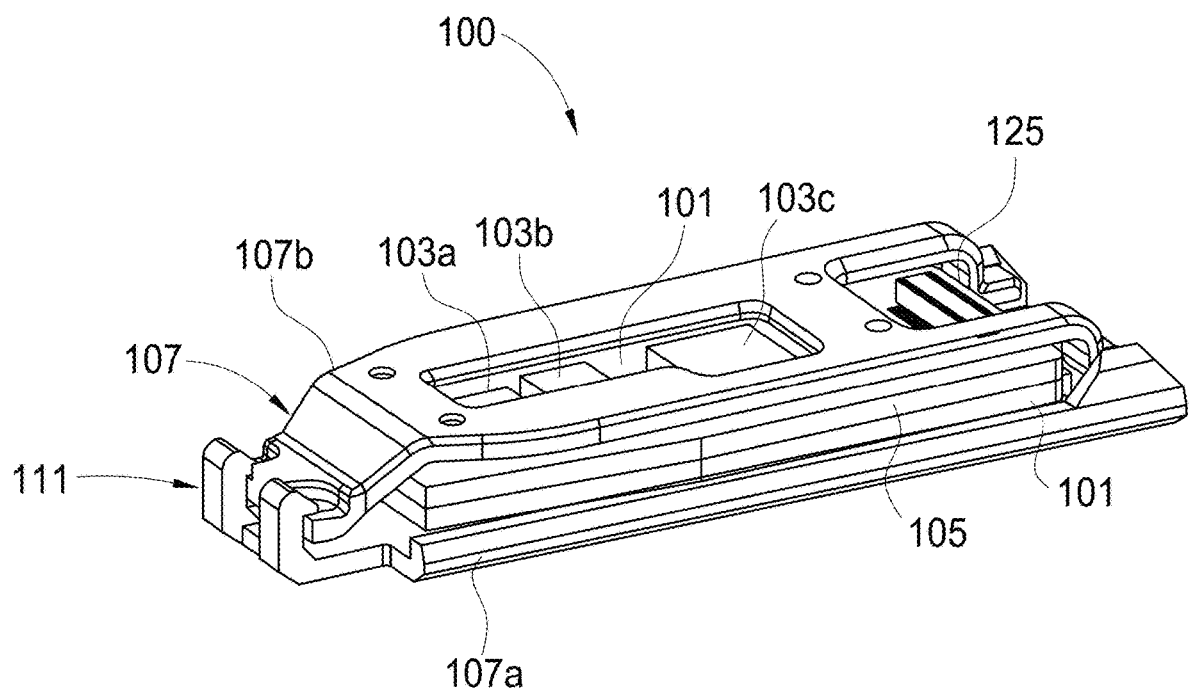
FIG. 1 is a perspective view of an embodiment of an assembly in accordance with this disclosure.

Reference will now be made to the drawings wherein like reference numerals identify similar structural features or aspects of the subject disclosure. For purposes of explanation and illustration, and not limitation, an illustrative view of an embodiment of an assembly in accordance with the disclosure is shown in FIG. 1 and is designated generally by reference character 100. Other embodiments and/or aspects of this disclosure are shown in FIG. 2.

Figure 2:
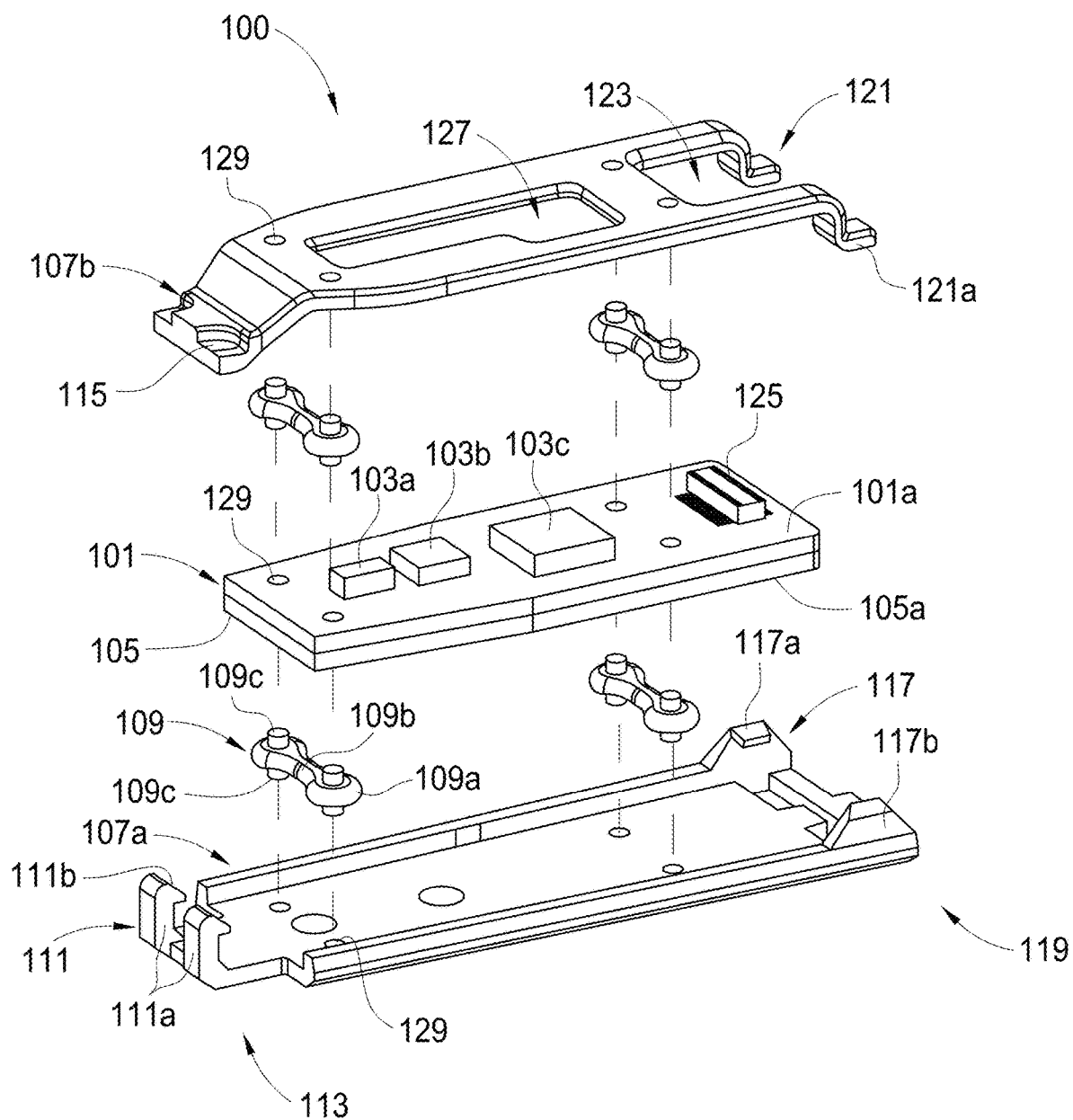
FIG. 2 is a perspective exploded view of the embodiment of FIG. 1.

Referring to FIGS. 1 and 2, an electronics assembly 100 can include a circuit board 101 comprising a stress sensitive device (e.g., one or more of components 103a, b, c). The assembly 100 can include a stiffening member 105 operatively connected to the circuit board 101 to stiffen the circuit board 101.

The assembly 100 can include a housing 107 disposed around the circuit board 101 and the stiffening member 105 to contain circuit board 101 and the stiffening member 105. The assembly 100 can include one or more elastic and/or flexible bumpers 109 disposed between the circuit board and the housing to provide shock absorption to the circuit board within the housing. The elastic and/or flexible bumpers 109 can be made of rubber, silicone, or any other suitable material that is elastic and/or flexible.

The circuit board 101 can be a printed circuit board (PCB), for example. The stress sensitive device can be an inertial measurement unit (IMU), for example. Any other suitable circuit board and/or stress sensitive device is contemplated herein.

As shown, the stiffening member 105 can be a rigid sheet flushly attached to a flat face (opposite device side 101a) of the circuit board 101. The stiffener 105 can be an aluminum sheet and can be bonded to the circuit board 101, for example. In certain embodiments, the stiffening member 105 can include the same shape as the circuit board 101 (e.g., having a tapered shape on a portion thereof). Any other suitable stiffening member 105 and/or shape thereof is contemplated herein.

As shown, the housing 107 can include a first housing member 107a and a second housing member 107b that clip together to retain the circuit board 101, the stiffening member 105, and the one or more elastic and/or flexible bumpers 109. In certain embodiments, the first housing member 107a can include a flexible clip structure 111 a first end 113 thereof. The second housing member 107b can include a mating feature 115 configured to receive the flexible clip structure 111, e.g., when pressed into the mating feature 115. For example, the flexible clip structure 111 can include a plurality of arms 111a that can flex (e.g., when the mating feature is pressed into ramp shaped heads 111b).

The first housing member 107a can include a retaining structure 117 (e.g., including a ramp feature 117a disposed on an extension 117b) at a second end 119 thereof opposite the first end 113. The second housing member 107b can include a clip structure 121 configured to engage the retaining structure 117, e.g., when pressed into the retaining structure 117a. For example, the clip structure 121 can include a plurality of dovetail legs 121a that can flex to be pressed into the retaining structure 117. Any other suitable structure(s) or means to attach the first housing 107a and the second housing 107b together is contemplated herein.

In certain embodiments, the second housing member 107b can define an aperture 123 over a data port 125 of the circuit board 101 to allow access to the data port 125 when the housing 107 is assembled. The second housing member 107b can include a window opening 127 to allow access to and/or clearance for the one or more circuit components, e.g., 103a, b, c.

In certain embodiments, the one or more bumpers 109 can include a plurality of bumpers 109 disposed on a device side 101a of the circuit board 101 between the second housing member 107b and the circuit board 101. The one or more bumpers 109 can also include a plurality of bumpers 109 disposed on a stiffener side 105a between the stiffener 105 and the first housing member 107a. The plurality of bumpers 109 can include a dumbbell shape having a plurality of wide portions 109a connected by a thinner neck 109b. The plurality of bumpers 109 can each include a bumper post 109c extending from each side of each wide portion 109a and configured to register each bumper 109 relative to the circuit board 101 and the housing 107. The first housing member 107a, the second housing member 107b, the circuit board 101, and the stiffener 105 can each include holes 129 for receiving each bumper post 109c.

The housing 107 can be shaped to mount to or within a goggle (e.g., a dovetail assembly) or optic. Any other suitable shape and/or use is contemplated herein. The housing 107 and/or any suitable components can be made of any suitable material (e.g., plastic, metal) and can be flexible, for example.

In accordance with at least one aspect of this disclosure, a method can include attaching a circuit board comprising a stress sensitive device to a stiffening member operatively connected to the circuit board to stiffen the circuit board, disposing the circuit board and stiffening member within a housing to contain the circuit board and the stiffening member, and disposing one or more elastic and/or flexible bumpers between the circuit board and the housing to provide shock absorption to the circuit board within the housing. The method can include mounting the housing containing the circuit board, stiffening member and the one or more elastic and/or flexible bumpers within a goggle or optic.

Certain embodiments include a PCB with an IMU that is restrained by two housing members that can snap together. Certain embodiments isolate the PCB from the housing using elastic and/or flexible bumpers and the PCB can be backed by an aluminum stiffener. Embodiments can be shaped to slide into a dovetail goggle housing. Embodiments reduce and/or eliminate stress on the circuit board and components thereof.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

Any suitable combination(s) of any disclosed embodiments and/or any suitable portion(s) thereof are contemplated herein as appreciated by those having ordinary skill in the art.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:
1. An electronics assembly, comprising:
    a circuit board comprising a stress sensitive device;
    a stiffening member operatively connected to the circuit board to stiffen the circuit board;
    a housing disposed around the circuit board and the stiffening member to contain the circuit board and the stiffening member; and
    one or more elastic and/or flexible bumpers disposed between the circuit board and the housing to provide shock absorption to the circuit board within the housing, wherein at least one of the one or more bumpers includes a dumbbell shape having a plurality of wide portions connected by a thinner neck,
    wherein the housing includes a first housing member and a second housing member that clip together to retain the circuit board, the stiffening member, and the one or more elastic and/or flexible bumpers,
    wherein the one or more bumpers include a plurality of bumpers disposed on a device side of the circuit board between the second housing member and the circuit board and a plurality of bumpers disposed on a stiffening side between the stiffening member and the first housing member.

2. The assembly of claim 1, wherein the circuit board is a printed circuit board (PCB).

3. The assembly of claim 1, wherein the stress sensitive device is an inertial measurement unit (IMU).

4. The assembly of claim 1, wherein the stiffening member is a rigid sheet flushly attached to a flat face of the circuit board.

5. The assembly of claim 4, wherein the stiffening member includes the same shape as the circuit board.

6. The assembly of claim 1, wherein the first housing member includes a flexible clip structure at a first end thereof, wherein the second housing member includes a mating feature configured to receive the flexible clip structure when pressed into the mating feature.

7. The assembly of claim 6, wherein the first housing member includes a retaining structure at a second end thereof opposite the first end, wherein the second housing member includes a clip structure configured to engage the retaining structure when pressed into the retaining structure.

8. The assembly of claim 1, wherein the second housing member defines an aperture over a data port of the circuit board to allow access to the data port when the housing is assembled.

9. The assembly of claim 1, wherein the plurality of bumpers each include a bumper post extending from each side of each wide portion configured to register each bumper relative to the circuit board and the housing.

10. The assembly of claim 9, wherein the first housing member, the second housing member, the circuit board, and the stiffening member each include holes for receiving each bumper post.

11. The assembly of claim 1, wherein the second housing member includes a window opening to allow access to and/or clearance for one or more circuit components.

12. The assembly of claim 11, wherein the housing is shaped to mount to or within a goggle or optic.

13. A method comprising:
attaching a circuit board comprising a stress sensitive device to a stiffening member operatively connected to the circuit board to stiffen the circuit board;
disposing the circuit board and stiffening member within a housing to contain the circuit board and the stiffening member; and
disposing one or more elastic and/or flexible bumpers between the circuit board and the housing to provide shock absorption to the circuit board within the housing, wherein at least one of the one or more of bumpers includes a dumbbell shape having a plurality of wide portions connected by a thinner neck,
wherein the housing includes a first housing member and a second housing member that clip together to retain the circuit board, the stiffening member, and the one or more elastic and/or flexible bumpers,
wherein the one or more bumpers include a plurality of bumpers disposed on a device side of the circuit board between the second housing member and the circuit board and a plurality of bumpers disposed on a stiffening side between the stiffening member and the first housing member.

\* \* \* \* \*